US008822032B2

(12) United States Patent
Borrelli et al.

(10) Patent No.: US 8,822,032 B2
(45) Date of Patent: Sep. 2, 2014

(54) PHOSPHOR CONTAINING GLASS FRIT MATERIALS FOR LED LIGHTING APPLICATIONS (75) Inventors: Nicholas Francis Borrelli, Elmira, NY (US); Lisa Ann Lamberson, Painted Post, NY (US); Robert Michael Morena, Lindley, NY (US); William R Trutna, Atherton, CA (US)

(73) Assignee: Corning Incorporated, Corning, NY (US)

( * ) Notice: Subject to any disclaimer, the term of this patent is extended or adjusted under 35 U.S.C. 154(b) by 366 days.

(21) Appl. No.: 13/281,671

(22) Filed: Oct. 26, 2011

(65) Prior Publication Data

US 2012/0107622 A1    May 3, 2012

Related U.S. Application Data (60) Provisional application No. 61/407,710, filed on Oct. 28, 2010.

(51) Int. Cl.
C03C 3/066 (2006.01)
C03C 3/072 (2006.01)
(Continued)

(52) U.S. Cl.
CPC .......... C09K 11/02 (2013.01); C03C 3/066 (2013.01); C03C 3/072 (2013.01); C03C 8/04 (2013.01); C03C 8/10 (2013.01); C03C 8/14 (2013.01); C03C 14/004 (2013.01); C03C 14/006 (2013.01); C03C 17/002 (2013.01); C03C 17/007 (2013.01); C03C 17/02 (2013.01); C03C 17/008 (2013.01); H01L 33/501 (2013.01); C09K 11/7774 (2013.01)
USPC .......... 428/426; 428/325; 428/428; 428/702; 501/17; 501/22; 501/26; 501/75; 501/77

(58) Field of Classification Search
CPC .......... C03C 3/066; C03C 3/072; C03C 4/12; C03C 8/14; C03C 14/004; C03C 14/006; C03C 17/007; C03C 17/008; C03C 17/02
See application file for complete search history.

(56) References Cited

U.S. PATENT DOCUMENTS 6,572,785 B2   6/2003  Justel et al.
7,319,289 B2   1/2008  Suehiro et al. ............. 313/485

(Continued)

FOREIGN PATENT DOCUMENTS

DE   102008021438 A1   12/2009
EP       0582716 A1    2/1994

(Continued)

OTHER PUBLICATIONS

V. Diez-Blanco et al; "Waveguide Structures Writtem in SF57 Glass With FS-Laser Pulses Above the Critical Self-Focusing Threshold"; Applied Surface Science, 252 (2006) 4523-4526.

(Continued)

Primary Examiner — David Sample
(74) Attorney, Agent, or Firm — Ryan T. Hardee (57) ABSTRACT The disclosure is directed to glass frits materials containing phosphors that can be used in LED lighting devices and for methods associated therewith for making the phosphor containing frit materials. Suitable non-lead glasses have a composition, in mol %, in the range of 20-24% $K_2O$, 8-12% ZnO, 2-6% $Al_2O_3$, 35-41% $B_2O_3$ and 22-28 $SiO_2$. Suitable leaded glasses have a composition, in wt %, in range of 72-79% PbO, 8-13% $Al_2O_3$, 8-13% $B_2O_3$, 2-5% $SiO_2$ and 0-0.3% $Sb_2O_3$. Commercial high-lead glass can be used in practicing the disclosure. Among the unique advantages are the ability to blend two or more phosphors within the same frit layer which will yield a multi-phosphor-containing glass after firing; the ability to deposit the phosphor onto a substrate into a desired geometric pattern; and the fluorescing layer can be applied to the active plane, with the glass serving as protective substrate.

9 Claims, 7 Drawing Sheets (51) Int. Cl.

| | |
|---|---|
| *C03C 8/04* | (2006.01) |
| *C03C 8/10* | (2006.01) |
| *C03C 8/14* | (2006.01) |
| *C03C 17/04* | (2006.01) |
| *C03C 14/00* | (2006.01) |
| *C09K 11/02* | (2006.01) |
| *C09K 11/78* | (2006.01) |
| *C09K 11/80* | (2006.01) |
| *H01L 33/50* | (2010.01) |
| *C03C 17/00* | (2006.01) |
| *C03C 17/02* | (2006.01) |
| *C09K 11/77* | (2006.01) |

(56) References Cited

U.S. PATENT DOCUMENTS

| | | | |
|---|---|---|---|
| 7,811,471 B2 | 10/2010 | Iwao et al. | 252/301.4 |
| 7,825,575 B2 | 11/2010 | Sawanobori et al. | 313/498 |
| 7,989,236 B2 | 8/2011 | Yamaguchi et al. | 428/26 |
| 8,206,613 B2 | 6/2012 | Fujita et al. | 252/301.4 |
| 8,344,404 B2 | 1/2013 | Fujita et al. | 257/98 |
| 2007/0064131 A1* | 3/2007 | Sawanobori et al. | 348/294 |
| 2008/0074029 A1 | 3/2008 | Suehiro | |
| 2008/0284315 A1 | 11/2008 | Tasumi et al. | 313/503 |
| 2009/0072700 A1* | 3/2009 | Kameshima et al. | 313/483 |
| 2009/0173960 A1 | 7/2009 | Martin et al. | 257/98 |
| 2009/0186433 A1 | 7/2009 | Yamaguchi et al. | 438/26 |
| 2009/0314989 A1* | 12/2009 | Iwao et al. | 252/301.4 F |
| 2010/0263723 A1 | 10/2010 | Allen et al. | 136/259 |
| 2011/0198539 A1* | 8/2011 | Iwao et al. | 252/301.36 |
| 2012/0293981 A1 | 11/2012 | Motoya et al. | 362/84 |
| 2013/0015761 A1 | 1/2013 | Motoya et al. | 313/512 |
| 2013/0049575 A1 | 2/2013 | Fujita et al. | 313/503 |

FOREIGN PATENT DOCUMENTS

| | | | |
|---|---|---|---|
| EP | 1880983 | 1/2008 | C03C 8/24 |
| EP | 1880983 A1 | 1/2008 | |
| EP | 2036965 | 3/2009 | C09K 11/00 |
| EP | 2036965 A1 | 3/2009 | |
| EP | 2120271 | 11/2009 | H01L 33/50 |
| JP | 2003258308 A | 9/2003 | |
| JP | 2008169348 | 7/2008 | C09K 11/08 |
| JP | 2008169348 A * | 7/2008 | |
| JP | 2012031328 | 2/2012 | C09K 11/00 |
| JP | 2012158494 | 8/2012 | C03C 8/04 |
| JP | 2012180488 | 9/2012 | C09K 11/00 |
| KR | 2010135223 | 12/2010 | H01L 33/48 |
| WO | WO2009104356 A * | 8/2009 | |
| WO | WO2011013505 | 2/2011 | H01L 33/50 |
| WO | WO2011065322 | 6/2011 | H01L 33/56 |
| WO | WO2011111462 | 9/2011 | H01L 33/50 |
| WO | WO2012100132 | 7/2012 | C09K 11/08 |
| WO | WO2013001971 | 3/2013 | C03C 8/02 |

OTHER PUBLICATIONS

Mueller-Mach et al; "Highly Efficient All-Nitride Phosphor-Converted White Light Emitting Diode"; Phys. Stat. Sol. (A) 202, No. 9, 1727-1732 (2005).

Park et al; "Enhanced Luminescence Efficiency for Bi, Eu Doped Y2O3 Red Phosphors for White LEDs" Solid State Phenomena vols. 124-126 (2007) pp. 379-382.

Xie et al; "Rare-Earth Activated Nitride Phosphors; Synthesis Luminescence and Applications" Materials, 2010, 3, 3777-3793.

Xie et al; "Silicon-Based Oxynitride and Nitride Phosphors for White LEDs—A Review" Science and Technology of Advanced Materials 8 (2007) 588-600.

Won et al; "Effect of Phosphor Geometry on the Luminous Efficiency of High-Power White Light-Emitting Diodes With Excellent Color Rendering Property"; Optics Letters, (2009) vol. 34, No. 1 pp. 1-3.

PCT/US2011/056503 Search Report.

Patent Abstract of JP 20032583058; Publication Date: Sep. 12, 2003.

\* cited by examiner

PHOSPHOR CONTAINING GLASS FRIT MATERIALS FOR LED LIGHTING APPLICATIONS

CROSS-REFERENCE TO RELATED APPLICATIONS

This application claims the benefit of priority under 35 U.S.C. §119 of U.S. Provisional Application Ser. No. 61/407,710 filed on Oct. 28, 2010 the content of which is relied upon and incorporated herein by reference in its entirety.

FIELD

The disclosure is directed to glass frits materials containing phosphors that can be used in LED lighting devices and for methods associated therewith for making the phosphor containing frit materials and their use in LED devices.

BACKGROUND

The lighting industry is quietly going through a revolution where LED-based lighting will gradually replace incandescent and fluorescent devices. The main driver for this change is the efficiency of the light emitting device, with LED-based devices being as much as 10 time more efficient (lumens/Watt) than incandescent lamps. Currently the source LED is based on gallium nitride (GaN) which can emit either in the ultraviolet (UV) range or blue light in the visible (Vis) range depending on composition. The typical blue LED emitting region is comprised of InGaN quantum wells with GaN barriers. Adding more indium tunes the emission to the green, but the efficiency decreases. Rather than make white light by mixing efficient red and blue LEDs with an inefficient InGaN green LED, most white LEDs are made using red and green emitting phosphors excited by an efficient GaN blue LED. The phosphors emissions mix with some of the blue LED light to make white light.

Figure 1:
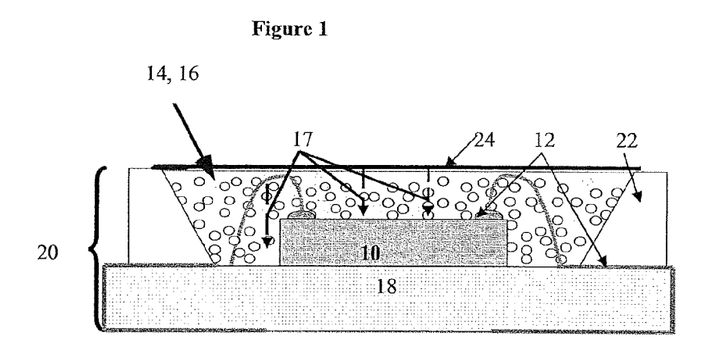
FIG. 1 illustrates a device in which phosphors encapsulated in a silicone materials are applied to and encapsulates a LED device in a vessel.

The overall efficiency of the white LED depends not only on the LED and the phosphor materials, but on the light extraction efficiency of the package. One of the impediments to efficiency is backscatter from the phosphor, which is typically a powder with high refractive index. A popular choice is Ce:YAG (cerium doped yttrium aluminum garnet), which has a refractive index of 1.85 at 460 nm, the emission wavelength of a typical blue LED.

a. FIG. 1 is a drawing of a representative white light LED in a typical surface mount package showing the LED 10, wire bonds 12, phosphor particles 14 (illustrated as circular dots) in a silicone material 16 surrounding phosphor particles 14, a package substrate 18 and a package 20 for a Marubeni SMTW47 InGaN LED. The package 20 consists of the substrate 18, an epoxy resin lens 24 (illustrated as a black line), and a vessel or cup 22 made from white plastic or ceramic to contain the silicone-phosphor mixture, protect the LED, and to reflect the light from the package. What the illustration cannot show is that the blue emission from the LED is scattered in all directions by the high refractive index particles in the low refractive index silicone. The light is partly trapped in the phosphor-silicone mixture and is lost to residual absorption in the package.

The phosphor powder is typically mixed with a silicone (refractive index 1.5) or epoxy and then applied to the top of the LED in its package as shown in FIG. 1. In the example illustrated by FIG. 1, a phosphor (14, red, or yellow) embedded in a silicone encapsulate 16 is excited by the 460 nm emission of the pn-junction of LED 10. However, there are undesirable properties when silicone encapsulation is used, among which are degradation over time and lack of thermal robustness; brittle conditions that arise from the use of the short light wavelengths; and undesirable backscatter 17 that arises from the refractive index mismatch between the phosphor (1.82-1.95) and the silicone (1.5). In view of these defects a better encapsulation host is desirable.

Some other details of the LED in its package are also shown in FIG. 1. The GaN LED is flip-chip bonded to a substrate, a design that provides good heat extraction and no shadowing by the bond pads or wire bonds. In addition the top surface has been roughened to prevent light trapping in the high refractive index GaN substrate. The red dashed line represents the InGaN quantum well emitting region.

SUMMARY

This disclosure is directed to the encapsulation of phosphors in glass which does not degrade or become brittle over time, is thermally robust and has a better refractive match to the phosphor reducing efficiency-robbing backscatter of blue light into the LED.

Figure 2:
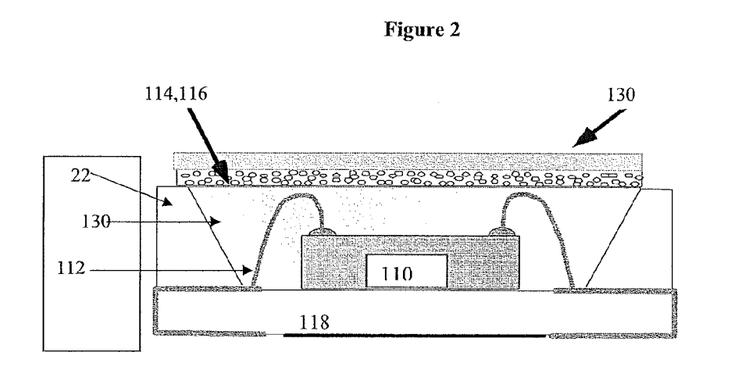
FIG. 2 illustrates a device in accordance with the present disclosure in which a consolidated phosphor-containing glass layer is formed on a glass substrate by deposition of one or a plurality of layers of a glass frit material mixed with one or a plurality of phosphors and firing the deposited phosphor/frit glass layer(s) after they have been applied to the substrate.
Figure 3:
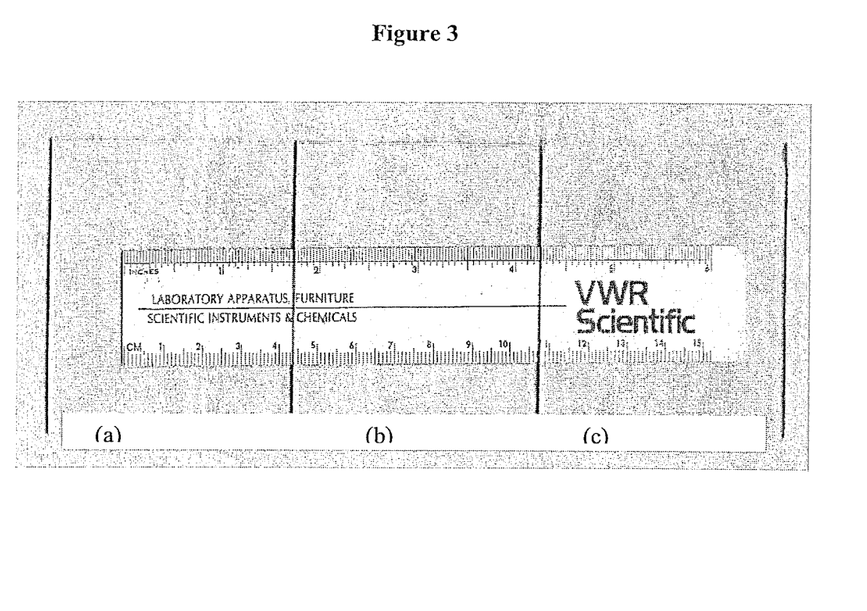
FIG. 3 is a color picture of a 20 wt % Ce:YAG phosphor-glass frit composition (Glass C) applied from left to right, as (a) 2-, (b) 3- and (c)4-layers to a glass plate to demonstrate clarity, the frit having an index=1.86 and the phosphor being <2 µm.
Figure 4:
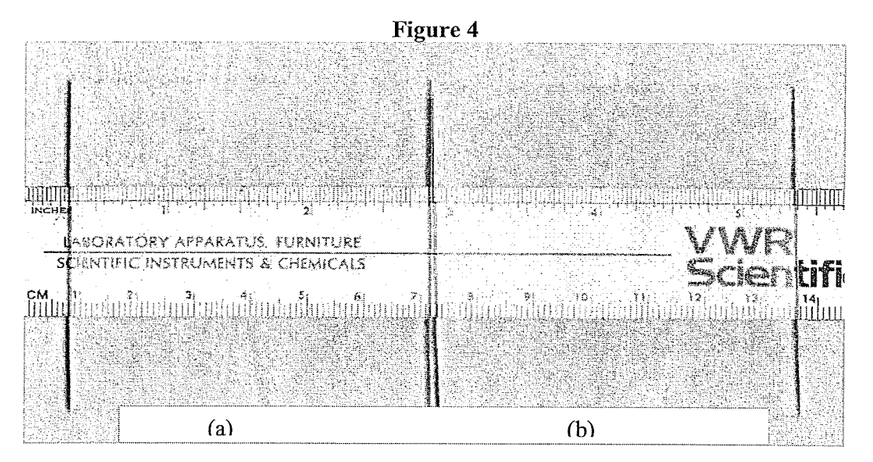
FIG. 4 is a color picture of the same materials in FIG. 3, applied to a glass plate as (a) 4- and (b)5-layers.
Figure 5:
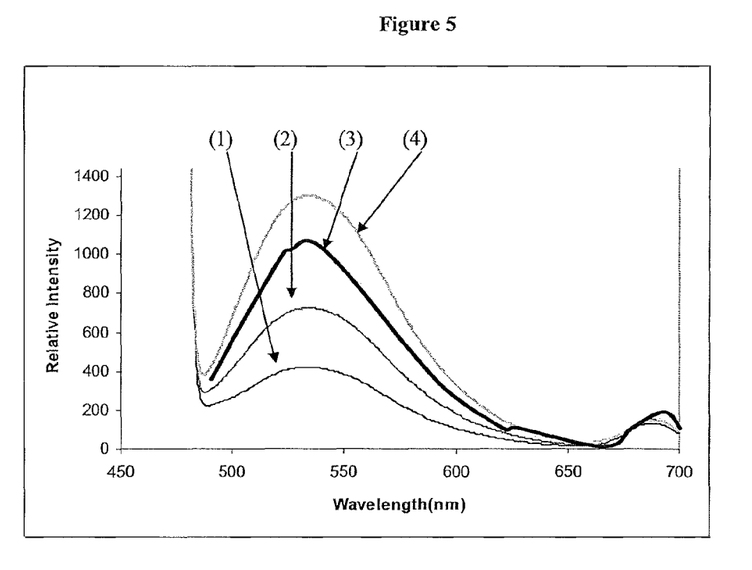
FIG. 5 is a graph of fluorescence relative intensity versus wavelength for a frit material having an index of 1.86 (Glass C) and containing 20 vol % YAG, where (1), (2), (3) and (4) represent 1-, 2-, 3- and 4-layers of applied phosphor-containing frit glass mixture.
Figure 6:
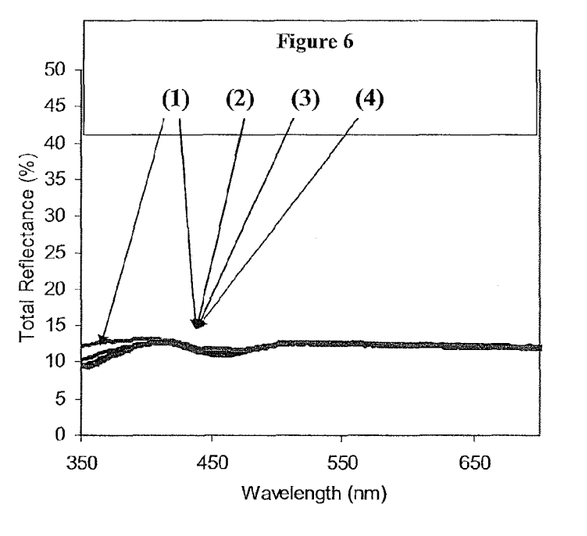
FIG. 6 is a graph of total reflectance versus wavelength illustrating backscatter using Glass C containing 20 wt % YAG, where (1), (2), (3) and (4) represent 1-, 2-, 3- and 4-layers of the applied phosphor-containing frit material.
Figure 7:
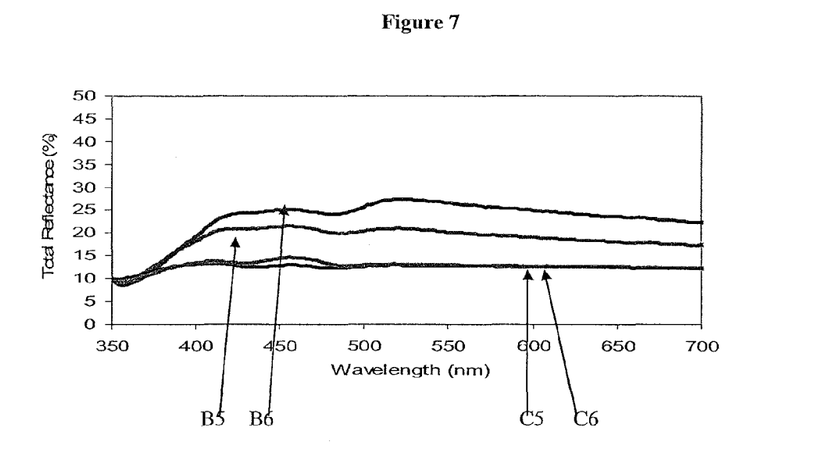
FIG. 7 is a graph of total reflectance versus wavelength illustrating backscatter using Glass C containing 20 wt % YAG, where B5 and B6, and C5 and C6 represent 5- and 6-layers of the applied phosphor-containing frit glass material B and C respectively, the phosphor loading being 15 wt %.
Figure 8:
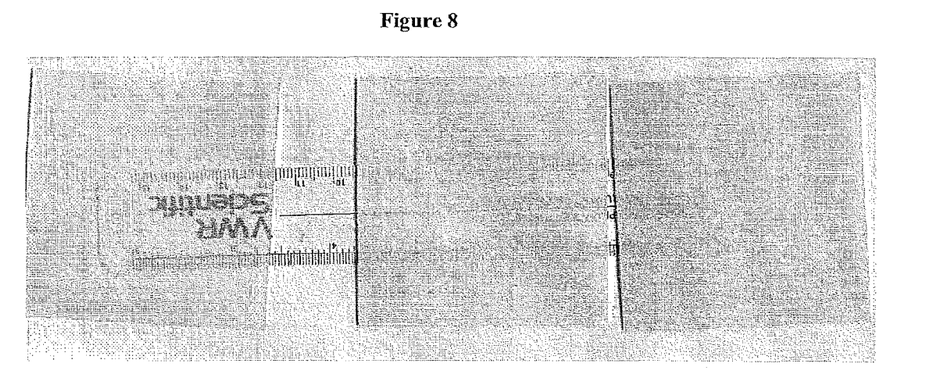
FIG. 8 is a color picture illustrating, from left to right, of a glass plate coated with 1-, 2- and 3 layers of a frit material C containing 20 wt % red phosphor.
Figure 9:
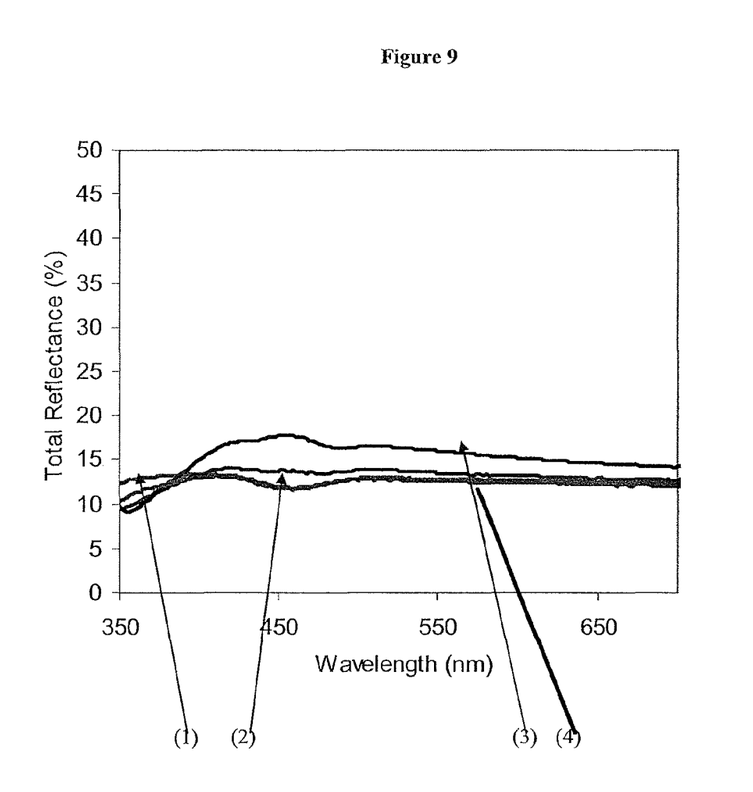
FIG. 9 is a graph illustrating total reflectance versus wavelength for 1-, 2, 3 and 4 layers of glass B containing 12.5 wt % YAG, the glass having an index of 1.88 and the phosphor being <2 µm, where (1), (2), (3) and (4) indicate the number of layers.

In an embodiment one or a plurality of phosphors are mixed with an appropriate glass frit material (the encapsulating material) to form a phosphor-frit glass mixture, and then applied to the LED, for example, a GaN or InGaN LED, within a vessel. In FIG. 2, which is similar to FIG. 1, a phosphor 114 (illustrated as circular dots) has been mixed with a glass frit material 116 to form a phosphor-fit glass mixture which is then deposited on a glass substrate 130 and fired to create a glass substrate having a phosphor-containing frit glass layer thereon. In addition, FIG. 2 illustrates the LED 110, wire bonds 112 and package substrate) 18 and the vessel or cup 122. The phosphor-containing frit glass mixture (114, 116) can be applied to the substrate 130 using standard paste processes, by a screen printing, or by spraying, followed by firing to produce a dense glass layer, the phosphor/frit layer, overlying the foregoing substrate. Since the fired phosphor-containing frit mixture is a glass, a cover lens may not be required. This disclosure is directed to the preparation, application, and thermal processing of the mixed frit/phosphor materials in the form shown in FIG. 2. The disclosure further includes a choice of frit glass compositions that can be used to provide the correct thermal characteristics while being consistent with the addition of the phosphor and its ultimate application to an appropriate glass substrate.

Figure 10:
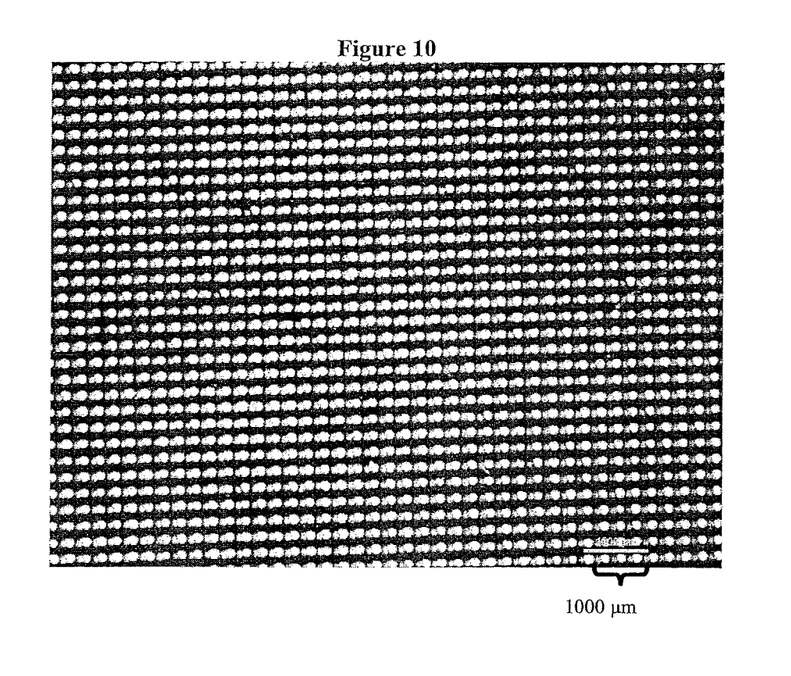
FIG. 10 illustrates the deposition of the phosphor onto a substrate in a desired geometric pattern, for example, by screen or ink jet printing.
Figure 11:
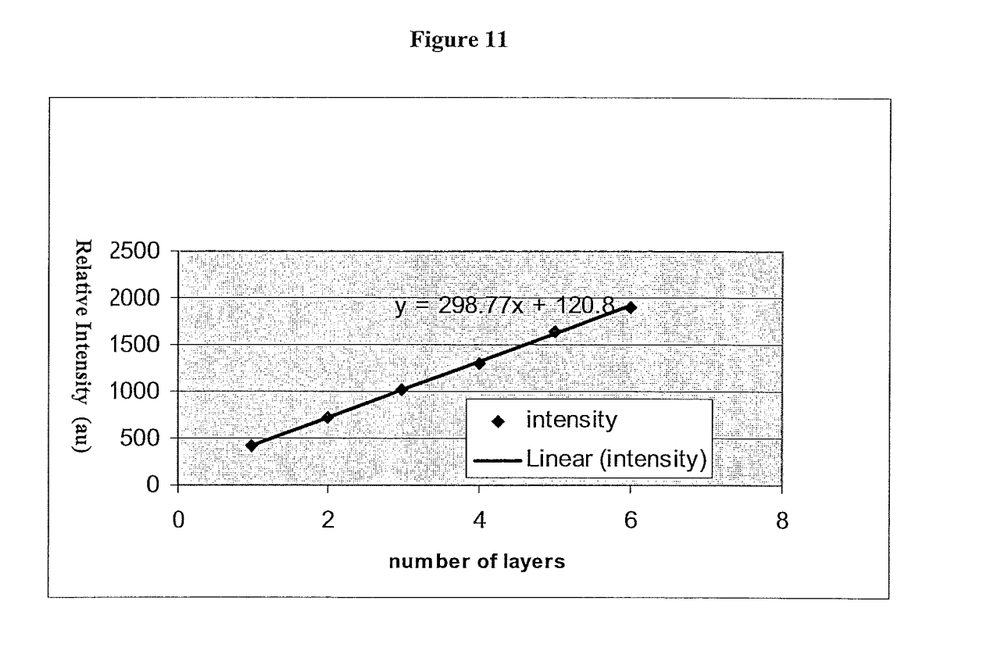
FIG. 11 is a graph illustrating relative fluorescence intensity with 460 nm excitation versus the number of layers phosphor-containing frit glass materials layers that have been applied.
Figure 12:
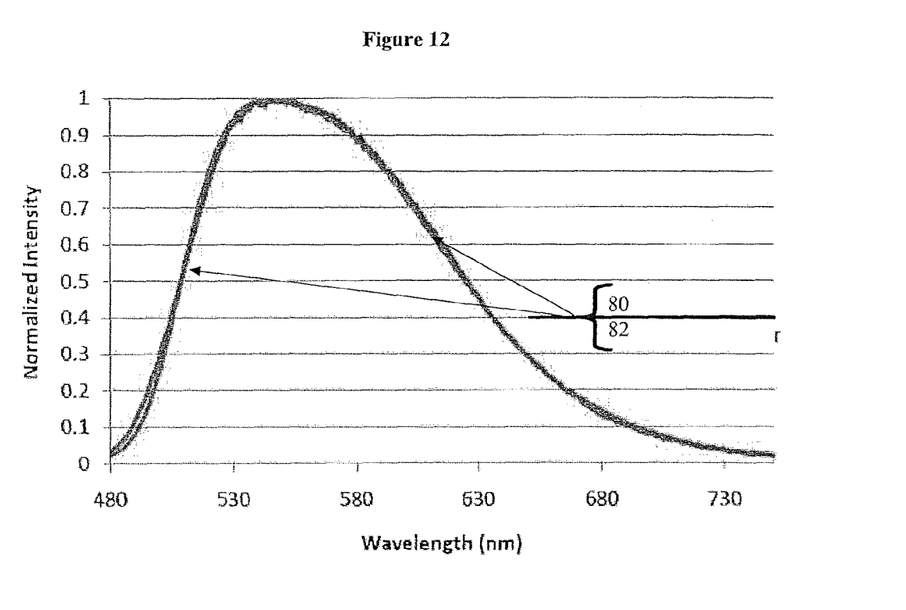
FIG. 12 is a graph illustrating that the emission spectra of the phosphor/glass 82 and the phosphor-only 80 are essentially identical.

The advantages of the present disclosure are:
(1) The consolidated phosphor-containing glass layer and the resulting device overall are thermally more robust than when a silicone is used as the encapsulation material.
(2) The consolidated phosphor-containing glass layer has better chemical and environmental stability.
(3) There is a better refractive index match between the consolidated phosphor-containing layer and the layer containing the pn-junction which reduces backscatter.
(4) The capability of combining different phosphors into a single layer.
(5) The ability to make geometric patterns of the phosphor on the substrate as is illustrated by FIG. 10
(6) Suitability for a thick film application to active plane.
(7) The ability to control the packaged LED color or white point. Since the phosphor plate is made as a separate piece, the optical thickness and emission color can be measured before assembly, thus reducing the number of reject LEDs.

DETAILED DESCRIPTION

Reference will now be made in detail to various embodiments of phosphor/frit glass materials and their use in LED articles, examples of which are illustrated in the accompanying drawings. Whenever possible, the same reference numerals will be used throughout the drawings to refer to the same or like parts.

The disclosure is directed a glass containing at least one phosphor; and to a process whereby a phosphor powder, or plurality of different phosphor powders, is combined with a suitable fritted glass material, the "frit glass", and a liquid organic vehicle (for example without limitation, turpinol, ethylcellulose with dispersants and surfactants) to form a frit paste. The paste is then deposited on a compatible substrate (a substrate whose CTE is matched to within $5\times10^{-7}/°$ C. of the frit glass), for example without limitation, by screen printing or spraying, (screen print, or spray) and then heated to a suitable first temperature to drive of the organic vehicle and then heated to a higher second temperature to consolidate the phosphor/frit glass mixture into a dense phosphor-containing glass. The first temperature is for driving off the organic vehicle and it is determined by, for example, the boiling point of the organic vehicle or the use of vapor pressure data and can be carried out at atmospheric pressure or under vacuum. The second higher temperature that is used to consolidate or fire the phosphor/frit glass mixture into a dense glass is determined by the frit material, with the provision that the softening temperature of the substrate to which the phosphor/frit glass mixture is applied has to be at least 100° C. higher than the consolidation or firing temperature of the phosphor/frit glass mixture. This phosphor/frit glass mixture can be applied as a layer on or adjacent to the active plane of a LED device. The amount of phosphor powder in the phosphor/frit glass mixture can be varied to the desired amount. The ultimate thickness of the consolidated phosphor-contain frit layer can be increased by a plurality of depositions of the phosphor/frit glass mixture.

The phosphor-containing frit glass mixture materials are different from the same frit material without the phosphor. Specifically, the addition of a specific phosphor phase to the frit material alters the rheological properties of the resulting phosphor-frit glass paste and the subsequent consolidation thermal treatment. The consolidation thermal treatment must be such that it does not degrade the fluorescent property of the phosphor. This is an important factor in the choice of the frit glass and the subsequent processing. It is the appropriate finding of this combination of the properties, namely the frit glass composition, the particular phosphor material and the glass substrate, that make up the invention. Because of the temperature limitation of the phosphor-frit glass material and the potential for degradation of certain phosphor materials, for example, Ce/YAG, it is necessary to use frit materials whose melting temperature is sufficient low such that the phosphors present in a phosphor-frit mixture are not degraded. The result of this restriction is that higher CTE frit materials are used with the result subsequently dictates the choice of the substrate glass so that the CTE of the phosphor-containing frit glass formed by a firing a phosphor-frit glass mixture will match the substrate CTE. The composition of a frit materials described herein was found to be compatible with a yellow YAG phosphor and a red oxynitride-based phosphor.

Phosphor materials are commercially available from Beijing Yugi Science & Technology Co. Ltd. (Beijing, China), Shanghai Keyan Phosphor Technology Co. Ltd (Shanghai, China) and Litec-LLL GmbH (Greifswald, Germany); and have also been described in patents and technical literature, for example, U.S. Pat. Nos. 6,572,785 and 7,442,326, and W. J. Park et al., "*Enhanced Luminescence Efficiency for Bi, Eu doped $Y_2O_3$ Red Phosphors for White LEDs,*" Solid State Phenomena, Vols. 124-126 (2007), pages 379-382, and Rong-Jun Xie et al., "*Silicon-based oxynitride and nitride phosphors for white LEDs—A review,*" Science and Technology of Advanced Materials 8 (2007), pages 588-600.

Frit Glass Compositions

Table I shows the composition of a non-lead base frit glass A, in mole %, that was used for some of the phosphor-frit mixtures used herein. Glass A has a coefficient of thermal expansion of $84.3 \times 10^{-7}/°$ C. and a softening point of 596° C. which is compatible with the substrate glass, Corning Code 2317 glass. The frit glass A composition was melted in a platinum crucible at 1500° C. for 6 hrs. The melt glass was then poured on a steel table and allowed to cool to room temperature. After cooling the glass was ground into particles having a size of −400 mesh. This ground glass was then used to make blends or mixtures with the phosphor materials indicated in Table 2. The blends in Table 2 are expressed on a weight % basis. After weighing the materials for each blend or mixture, the frit glass and phosphor materials were placed in Nalgene™ or similar bottles with alumina media and rolled (milled) for a time in the range of 15 to 40 minutes, typically approximately 20 minutes. After rolling the blends were sieved through a −325 mesh screen. In some cases the blends were wet milled or freeze-dried to help remove agglomerates and were then sieved through a −325 mesh screen.

The choice of the glass A frit glass material is optimum from the standpoint of its softening temperature of 590° C. which is below the maximum use temperature of the Ce:YAG phosphor, and the CTE match of this frit glass to the substrate. It is always the maximum phosphor temperature that dictates the correct frit material choice, that is, a frit whose sealing temperature is lower than the maximum temperature of the phosphor. The substrate is chosen to match the CTE of the phosphor-containing frit material.

Suitable frit glass compositions include both lead and non-lead compositions. For example without limitation, suitable non-lead glasses have a composition, in mol %, in the range of 20-24% $K_2O$, 8-12% ZnO, 2-6% $Al_2O_3$, 35-41% $B_2O_3$ and 22-28 $SiO_2$. Suitable leaded glasses have a composition, in mol %, in range of 72-79% PbO, 8-13% $Al_2O_3$, 8-13% $B_2O_3$, 2-5% $SiO_2$ and 0-0.3% $Sb_2O_3$ (glasses B and C in Table 1). Table 1 gives the analyzed composition of non-leaded and leaded glasses A, B and C to which phosphors were added to make the phosphor-containing frit composition that were used herein.

Several other frit bends were also made using two commercially available glasses to make the frit materials to which phosphors were added. These glasses were SF-6 and SF-57 (Schott AG, Mainz, Germany. The exact composition of the SF-6 and SF-57 glasses (Schott AG) is not known, except that both are known to be high lead glasses. The blends made with these glasses are shown in weight % in Table 2. In all cases the blends shown in Table 2 were made in the same way as the ones mentioned above using Glass A. The refractive indices of the frit materials and the phosphors used herein are given in Table 3.

TABLE 1

Analyzed Composition of Some Glasses Used for Phosphor Materials

| Oxides | Glass A (Mol %) | Glass B (mol %) | Glass C (mol %) | SF-6 (wt %) | SF-57 (wt %) |
|---|---|---|---|---|---|
| $K_2O$ | 22.5 | — | — | Lead silicate glass formed by $SiO_2$ and PbO. Other oxides may be present | Lead silicate glass formed by $SiO_2$ and PbO. 40-50% Pb cationic content. Other oxides may be present. |
| ZnO | 10.0 | — | — | | |
| $Al_2O_3$ | 4.0 | 9.18 | 10.59 | | |
| $B_2O_3$ | 38.5 | 11.10 | 11.20 | | |
| $SiO_2$ | 25.0 | 3.24 | 3.80 | | |
| PbO | | 76.39 | 74.39 | | |
| $Sb_2O_3$ | | 0.08 | — | | |

TABLE 2

Phosphor containing glass frit blends in weight % glass/phosphor

| | Sample | | | | | | | | | | |
|---|---|---|---|---|---|---|---|---|---|---|---|
| Glass/Phosphor | 1 | 2 | 3 | 4 | 5 | 6 | 7 | 8 | 9 | 10 | 11 |
| B | 90 | — | — | 80 | — | — | — | — | 83.5 | 95 | 83.5 |
| C | — | 80 | 80 | — | 90 | — | 87 | 87.5 | — | — | — |
| A | — | — | — | — | — | 80 | — | — | — | — | — |
| Red phosphor | 10 | — | 5 | — | — | — | 3 | — | — | 5 | — |
| YAG phosphor (1.8 um) | — | 20 | 15 | 20 | 10 | 20 | 10 | 12.5 | 16.5 | — | — |
| YAG phosphor (3.5 um) | — | — | — | — | — | — | — | — | — | — | 16.5 |

| | Sample | | | | | |
|---|---|---|---|---|---|---|
| Glass | 12 | 13 | 14 | 15 | 16 | 17 |
| SF-6 | | | | | 80 | 95 |
| SF-57 | 80 | | | | | |
| YAG phosphor (2 μm) | | 5 | — | 20 | 20 | 5 |
| Red phosphor | 20 | — | 5 | — | — | — |

TABLE 3

| | Refractive index (n) | | | | | | |
|---|---|---|---|---|---|---|---|
| Glass | A | B | C | SF-6 | SF-57 | YAG Phosphor | Red Phosphor |
| n | 1.65 | 1.880 | 1.86 | ~1.82 | ~1.85 | ~1.84 | 1.9 to ~2.0 |
| CTE × $10^{-7}$ | 84.3 | 89 | 84 | 81 | 83 | | |

The phosphor-frit glass blends were converted into a paste by adding organic fluids to the frit blends. This paste is then used to screen print the frit glass blends onto a substrate glass 130. Alternatively, the organic-containing phosphor/glass blend was made sufficiently fluid so that it could be sprayed onto a surface. For all of the frit blends mentioned above the substrate glass used was Corning Gorilla™ Glass as it is expansion matched to the frit glasses used in each of the blends. In some examples the phosphor-frit glass blends were screen printed to make layer thicknesses of 15 μm (1-layer), 30 μm (2-layer), 45 μm (3-layer) and 60 μm (4-layer) on Corning Gorilla™ Glass substrates (CTE=$83 \times 10^{-7}$, softening point 843° C.). In other examples the thickness of the individual layers was in the range of 15-50 μm. In other examples the 4- and 5-layers of the phosphor-frit glass blend was applied. After screen printing the samples are placed in a small box furnace and fired to 350° C. for one (1) hour at a temperature ramp rate of 2° C./min. This firing temperature is used to burn out the organic materials in the screen printed phosphor-frit glass paste. After the organics are burnt out the samples were heated to a temperature of 575° C., 600° C. or 650° C. at a ramp rate of 2° C./min and were then held at the temperature for two (2) hours. During this firing procedure the phosphor-frit glass blend sinters and forms a smooth glassy layer, a phosphor/frit glass layer, on the substrate glass. The different firing temperatures determine how smooth and glassy the final sintered phosphor/frit glass layer will be. After the firing was completed the resulting product was a glass substrate having a thickness of a phosphor/frit glass thereon. The product glass can then be cut to the desired size for use in an LED device, for example, as illustrated in FIG. 2.

As indicated above, FIG. 1 is a drawing of a white light LED in a typical surface mount package, FIG. 1 illustrates the LED 10, wire bonds 12, phosphor particles 14 (illustrated as circular dots) in a silicone material 16 surrounding phosphor particles 14, a substrate 18 and a package 20 for a LED, for example, an Marubeni SMTW47 InGaN LED (http://tech-led.com/data/L850-66-60-130.pdf). The package 20 consists of the substrate 18, an epoxy resin lens 24, and a vessel or cup 22 made from white plastic or ceramic to contain the silicone-phosphor mixture, protect the LED, and to reflect the light from the package. In FIG. 2, which is similar to FIG. 1, a phosphor 114 (illustrated as circular dots) has been mixed with a glass frit 116 to form a phosphor/frit glass mixture which deposited on a glass substrate 130 and fired to create a glass substrate having a phosphor/frit glass layer thereon. In addition, FIG. 2 illustrates the LED 110, wire bonds 112 and package substrate) 18 and the vessel or cup 122. The phosphor/frit glass mixture material (114,116) can be applied to the substrate 130 using standard paste processes, by a screen printing, or by spraying, followed by firing to produce a dense phosphor/frit glass layer overlying the substrate. As a result of incorporating the phosphor into a glass layer numerous advantages are obtained over the practice of mixing the phosphor into a silicone or epoxy material. In particular, the phosphor/frit glass layer and the resulting device overall are thermally more robust than when a silicone is used as the encapsulation material, and the phosphor/frit glass layer has better chemical and environmental stability. For example, one can incorporate red and yellow phosphors into a single frit glass blend. Since the phosphor/frit glass blend can be formed into a "paste" of varying fluidity, the blends are suitable for thick film application to the active plane. Other advantages include (1) reduced backscatter because the frit glass material can be chosen so that there is phosphor/frit glass materials achieve a better refractive index match between the phosphor and the frit glass and the layer containing the pn-junction (the LED); and (2) the ability to make geometric patterns of the phosphor on the substrate as is illustrated by FIG. 10. Finally, the use of the phosphor/frit glass blend imparts the ability to control the packaged LED color or white point. Since the phosphor-containing plate is made as a separate piece, the optical thickness and emission color can be measured before assembly, thus reducing the number of reject LEDs.

One unique advantage to the phosphor/frit glass mixture 1 approach of the present disclosure is the ability to blend two or more phosphors within the same frit layer which will yield a multi-phosphor-containing glass after firing. For example, varying the relative amount of, for example, a yellow and a red phosphor permits color control that would otherwise require two separate phosphor depositions (separate layers). Color control is a very important aspect of LED lighting applications. This unique multi-phosphor ability of the phosphor/frit glass blends enables the construction of an emission color palate by the variation of the phosphor mixture.

A second unique advantage of the phosphor/frit glass mixture method of the present disclosure is the ability to deposit the phosphor onto a substrate into a desired geometric pattern. This can be done either by screen printing or ink jet printing. An example is shown in FIG. 10 in which patterned phosphor/frit glass dots were formed on a substrate. Light will pass through the dots but is blocked by the black background shown in the figure.

A third unique advantage of the phosphor/frit glass material mixture method is that the fluorescing layer can be applied to the active plane, with the glass serving as protective substrate. In addition, using a screen printing method one can apply a patterned array of phosphor dots (more than one color if desired). One can also control the uniformity of the emission by appropriately varying the dot number density.

In one aspect the disclosure is directed to a glass article comprising a substrate and a phosphor-containing glass layer bonded to the substrate, wherein the phosphor-containing glass layer is a fired mixture of a frit glass and at least one phosphor, and the CTE of the phosphor-containing glass layer and the substrate are within $\pm 5 \times 10^{-7}$ of each other. In one embodiment the phosphor-containing glass layer is lead-free and is a fired mixture of a frit glass and at least one phosphor, and the difference in refractive index between the frit glass and the at least one phosphor is ≤0.20. In an embodiment the frit glass material is lead-free and consists essentially of, in mol %, 20-24% $K_2O$, 8-12% ZnO, 2-6% $Al_2O_3$, 35-41% $B_2O_3$ and 22-28% $SiO_2$. In another embodiment the frit glass is lead-free and consists essentially of, in mol %, 22.5±1% $K_2O$, 10±1% ZnO, 4±0.5% $Al_2O_3$, 38.8±1% $B_2O_3$ and 25±1.5% $SiO_2$. In a further embodiment the phosphor-containing glass layer is a lead-containing layer and is a fired mixture of a frit glass and at least one phosphor, and the difference in refractive index between the frit glass and the at least one phosphor is ≤0.06. In an embodiment the phosphor-containing glass layer is a lead-containing layer and is a fired mixture of a frit glass and at least one phosphor, and the difference in refractive index between the frit glass and the at least one phosphor is ≤0.02. In another embodiment the phosphor-containing glass layer is a lead-containing layer and is a fired mixture of a frit glass and at least one phosphor, and the difference in refractive index between the frit glass and the at least one phosphor is ≤0.01. In an additional embodiment where the phosphor-containing layer of the glass article contain lead the glass article is light scattering free. In one embodiment the lead-containing glass consisting essentially of, in mol %, 72-79% PbO, 8-13% $Al_2O_3$, 8-13% $B_2O_3$, 2-5% $SiO_2$ and 0-0.3% $Sb_2O_3$. In another embodiment the lead containing glass consisting essentially of, in mol %, 76.4±1% PbO, 9±0.6% $Al_2O_3$, 11±0.6% $B_2O_3$, 3.2±0.5% $SiO_2$ and 0.08±0.05% $Sb_2O_3$. In a further embodiment the lead-containing glass consists essentially of, in mol %, 74.4±1% PbO, 10.6±0.6% $Al_2O_3$, 11±0.6% $B_2O_3$, and 3.8±0.5% $SiO_2$.

The disclosure is further directed to a method for making a phosphor-containing glass, said method comprising:

providing a selected glass composition;

melting the composition and forming the melted composition into a glass;

grinding the melted glass into particles of −400 mesh to thereby form a frit glass having a selected composition;

blending the ground glass with one or a plurality of selected phosphors to form a phosphor-frit glass mixture;

milling the phosphor/frit glass mixture for a time in the range of 15-40 minutes;

sieving the milled phosphor/frit glass mixture through a −325 mesh screen converting the milled and sieved phosphor/frit glass blend into a paste by the addition of at least one organic liquid to the blend;

applying the paste onto a substrate surface;

firing the applied paste in air to a temperature of approximately 350° C. at a temperature ramp rate of 2° C./min and holding the paste at approximately 350° C. for 1 hour to burn out the organic material;

further firing the applied paste in air to a selected temperature in the range of 575-650° C. at a temperature ramp rate of 2° C./min and holding the applied paste at the selected temperature for 2 hours; and cooling the fired phosphor-fit glass to room temperature to yield a fired phosphor-frit glass applied to a substrate surface. In various embodiments the frit glass composition is selected from the groups consisting of, in mol %:

(a) 20-24% $K_2O$, 8-12% ZnO, 2-6% $Al_2O_3$, 35-41% $B_2O_3$ and 22-28 $SiO_2$;

(b) 22.5±1% $K_2O$, 10±1% ZnO, 4±0.5% $Al_2O_3$, 38.8±1% $B_2O_3$ and 25±1.5% $SiO_2$;

(c) 72-79% PbO, 8-13% $Al_2O_3$, 8-13% $B_2O_3$, 2-5% $SiO_2$ and 0-0.3% $Sb_2O_3$; and (d) 74.4±1% PbO, 10.6±0.6% $Al_2O_3$, 11±0.6% $B_2O_3$, and 3.8±0.5% $SiO_2$;

(e) 76.4±1% PbO, 9±0.6% $Al_2O_3$, 11±0.6% $B_2O_3$, 3.2±0.5% $SiO_2$ and 0.08±0.05% $Sb_2O_3$.

In an embodiment the CTE of the fired phosphor-fit glass is within $\pm 5\times 10^{-7}$ of the substrate surface to which it is applied.

The disclosure is further directed to a glass article comprising a substrate and a phosphor-containing glass layer bonded to the substrate; wherein the phosphor-containing glass layer is a fired mixture of a frit glass and at least one phosphor, and the CTE of the phosphor-containing glass layer and the substrate are within $\pm 5\times 10^{-7}$ of each other. In one embodiment, in the phosphor-containing glass layer the difference in refractive index between the frit glass of the layer and the at least one phosphor is ≤0.20. In another embodiment, in the phosphor-containing glass layer the difference in refractive index between the frit glass of the layer and the at least one phosphor is ≤0.20. In a further embodiment the phosphor-containing glass layer is lead-free and in the phosphor-containing glass layer the difference in refractive index between the frit glass and the at least one phosphor is ≤0.10. In various embodiments the frit glass composition is selected from the groups consisting of, in mol %:

(a) 20-24% $K_2O$, 8-12% ZnO, 2-6% $Al_2O_3$, 35-41% $B_2O_3$ and 22-28 $SiO_2$;

(b) 22.5±1% $K_2O$, 10±1% ZnO, 4±0.5% $Al_2O_3$, 38.8±1% $B_2O_3$ and 25±1.5% $SiO_2$;

(c) 72-79% PbO, 8-13% $Al_2O_3$, 8-13% $B_2O_3$, 2-5% $SiO_2$ and 0-0.3% $Sb_2O_3$; and (d) 74.4±1% PbO, 10.6±0.6% $Al_2O_3$, 11±0.6% $B_2O_3$, and 3.8±0.5% $SiO_2$;

(e) 76.4±1% PbO, 9±0.6% $Al_2O_3$, 11±0.6% $B_2O_3$, 3.2±0.5% $SiO_2$ and 0.08±0.05% $Sb_2O_3$.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

We claim:

1. A glass article comprising a substrate and a phosphor-containing glass layer bonded to the substrate, wherein the phosphor-containing glass layer is a fired mixture of a frit glass and at least one phosphor, and the CTE of the phosphor-containing glass layer and the substrate are within $\pm 5\times 10^{-7}/°$ C. of each other, wherein the phosphor-containing glass layer is lead-free and is a fired mixture of a fit glass and at least one phosphor, and the difference in refractive index between the frit glass and the at least one phosphor is ≤0.20 and wherein the frit glass material consists essentially of, in mol %, 20-24% $K_2O$, 8-12% ZnO, 2-6% $Al_2O_3$, 35-41% $B_2O_3$ and 22-28 $SiO_2$.

2. A glass article comprising a substrate and a phosphor-containing glass layer bonded to the substrate, wherein the phosphor-containing glass layer is a fired mixture of a frit glass and at least one phosphor, and the CTE of the phosphor-containing glass layer and the substrate are within $\pm 5\times 10^{-7}/°$ C. of each other, wherein the phosphor-containing glass layer is lead-free and is a fired mixture of a frit glass and at least one phosphor, and the difference in refractive index between the frit glass and the at least one phosphor is ≤0.20 and wherein the frit glass consists essentially of, in mol %, 22.5±1% $K_2O$, 10±1% ZnO, 4±0.5% $Al_2O_3$, 38.8±1% $B_2O_3$ and 25±1.5% $SiO_2$.

3. A glass article comprising a substrate and a phosphor-containing glass layer bonded to the substrate, wherein the phosphor-containing glass layer is a fired mixture of a frit glass and at least one phosphor, and the CTE of the phosphor-containing glass layer and the substrate are within $\pm 5\times 10^{-7}/°$ C. of each other, and wherein the phosphor-containing glass layer is a lead-containing layer and is a fired mixture of a fit glass and at least one phosphor, and the difference in refractive index between the frit glass and the at least one phosphor is ≤0.06.

4. The glass article according to claim 3, wherein the frit glass is a lead-containing glass consisting essentially of, in mol %, 72-79% PbO, 8-13% $Al_2O_3$, 8-13% $B_2O_3$, 2-5% $SiO_2$ and 0-0.3% $Sb_2O_3$.

5. The glass article according to claim 3, wherein the frit glass is a lead containing glass consisting essentially of, in mol %, 76.4±1% PbO, 9±0.6% $Al_2O_3$, 11±0.6% $B_2O_3$, 3.2±0.5% $SiO_2$ and 0.08±0.05% $Sb_2O_3$.

6. The glass article according to claim 3, wherein the frit glass is a lead-containing glass consisting essentially of, in mol %, 74.4±1% PbO, 10.6±0.6% $Al_2O_3$, 11±0.6% $B_2O_3$, and 3.8±0.5% $SiO_2$.

7. A glass article comprising a substrate and a phosphor-containing glass layer bonded to the substrate, wherein the phosphor-containing glass layer is a fired mixture of a frit glass and at least one phosphor, and the CTE of the phosphor-containing glass layer and the substrate are within $\pm 5\times 10_{-7}/°$ C. of each other, and wherein the phosphor-containing glass layer is a lead-containing layer and is a fired mixture of a frit glass and at least one phosphor, and the difference in refractive index between the fit glass and the at least one phosphor is ≤0.02.

8. A glass article comprising a substrate and a phosphor-containing glass layer bonded to the substrate,
wherein the phosphor-containing glass layer is a fired mixture of a frit glass and at least one phosphor, and
the CTE of the phosphor-containing glass layer and the substrate are within $\pm 5 \times 10^{-7}/°$ C. of each other,
and wherein the phosphor-containing glass layer is a lead-containing layer and is a fired mixture of a fit glass and at least one phosphor, and
the difference in refractive index between the frit glass and the at least one phosphor is ≤0.01.

9. The glass article according to claim 8 wherein the glass article is light-scatter free.

* * * * *